United States Patent [19]
Yasuda

[11] Patent Number: 5,264,851
[45] Date of Patent: Nov. 23, 1993

[54] A/D CONVERTER UTILIZING A FIRST REFERENCE VOLTAGE DIVIDER AND LEVEL SHIFTING OF A SECOND VOLTAGE DIVIDER BY INPUT SIGNAL

[75] Inventor: Akira Yasuda, Kawasaki, Japan

[73] Assignee: Kabushiki Kaisha Toshiba, Kawasaki, Japan

[21] Appl. No.: 867,531

[22] Filed: Apr. 13, 1992

[30] Foreign Application Priority Data

Apr. 12, 1991 [JP] Japan ................................. 3-79956

[51] Int. Cl.$^5$ .......................... H03M 1/34; H03M 1/36
[52] U.S. Cl. ...................................... 341/158; 341/159; 341/156
[58] Field of Search ........................ 341/158, 159, 156

[56] References Cited

U.S. PATENT DOCUMENTS

| | | | |
|---|---|---|---|
| 4,912,469 | 3/1990 | Van De Grift et al. | 34/159 |
| 4,983,973 | 1/1991 | Lewyn | 341/159 X |
| 5,019,821 | 5/1991 | Sugimoto | 341/156 |

*Primary Examiner*—Sharon D. Logan
*Attorney, Agent, or Firm*—Foley & Lardner

[57] ABSTRACT

An A/D converter having a first divided reference voltage output circuit for dividing a first reference voltage by m and outputting a plurality of first divided reference voltages; a second divided reference voltage output circuit for dividing a second reference voltage by n and outputting a plurality of second divided reference voltages; a level shift circuit for level-shifting the plurality of second divided reference voltages in accordance with an input voltage to be A/D converted, and outputting a plurality of third divided reference voltages; a comparator circuit for comparing each of the plurality of first divided reference voltages with each of the plurality of third divided reference voltages, and outputting a combination of one of the first divided reference voltage and one of the third divided reference voltages having a smallest voltage difference therebetween; and an encoder circuit for outputting a digital signal converted from the input signal, in accordance with the combination outputted from the comparator circuit.

20 Claims, 10 Drawing Sheets

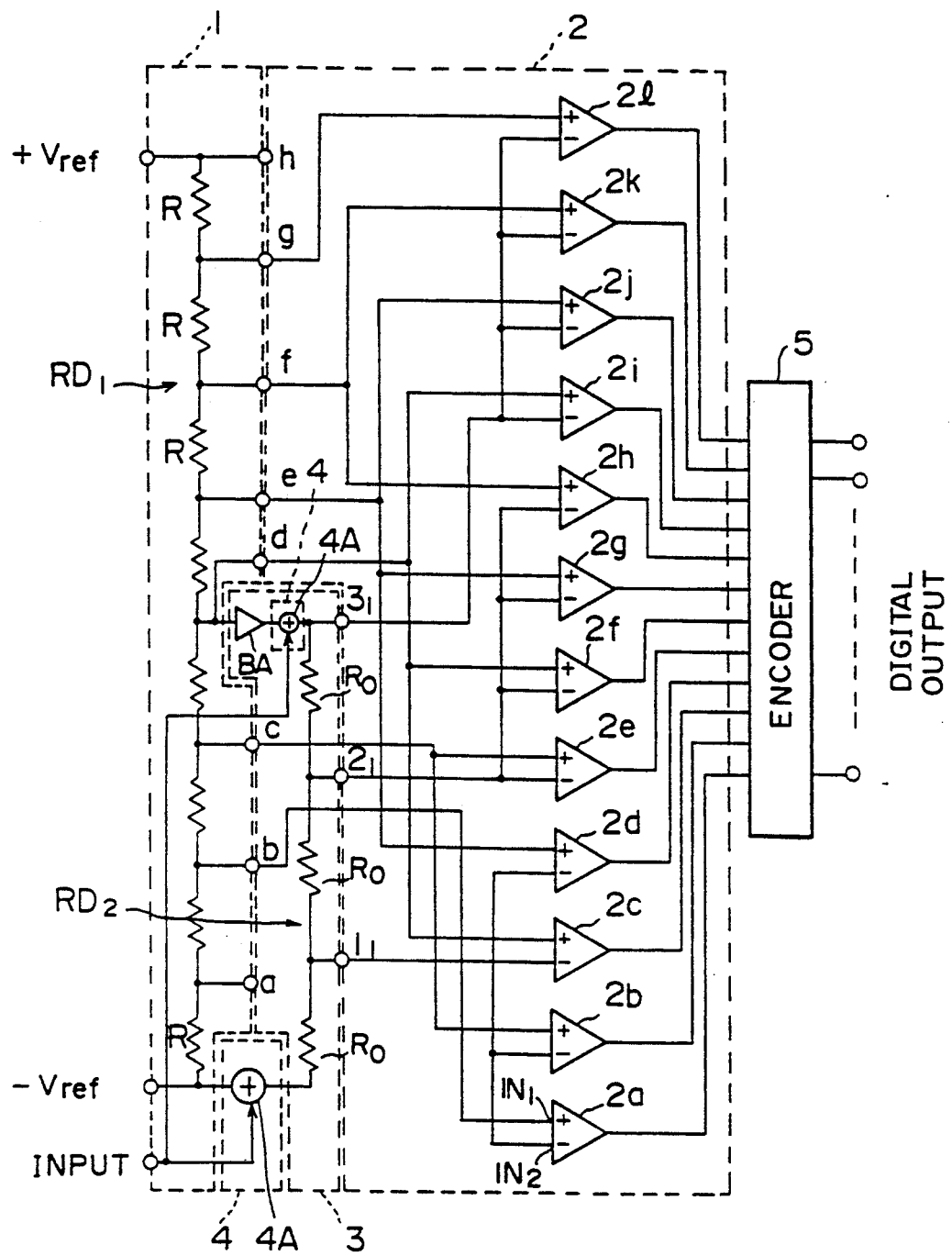
F I G. 6

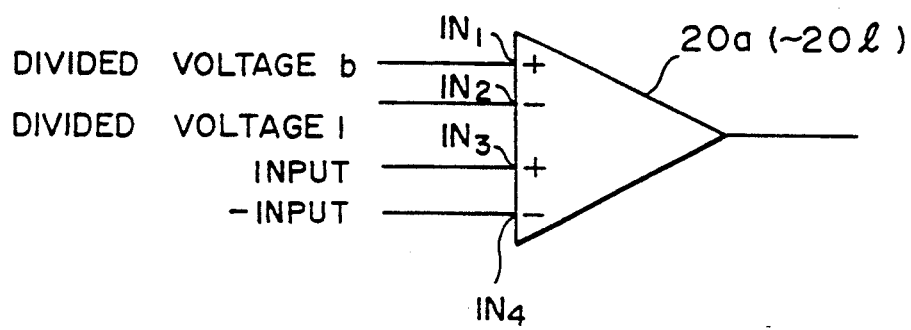
F I G. 7

A/D CONVERTER UTILIZING A FIRST REFERENCE VOLTAGE DIVIDER AND LEVEL SHIFTING OF A SECOND VOLTAGE DIVIDER BY INPUT SIGNAL

FIELD OF THE INVENTION

The present invention relates to an A/D converter.

BACKGROUND OF THE INVENTION

An example of conventional flash or parallel type A/D converters will be described with reference to FIG. 1. In a flash or parallel type A/D converter, comparators 102as to 102h compare voltages divided by a reference voltage generator 101 formed by resistors 101a to 101i with an input voltage (INPUT). Outputs of the comparators are supplied to logical circuits RC formed by inverters 103a to 103g and AND gates 104a to 104g. The logical circuits RC discriminate a change point in comparator output which output corresponds to the level of the input voltage (INPUT). In accordance with this discrimination result, an encoder 105 generates a digital signal indicating the level of the input voltage (INPUT).

A parallel type A/D converter (not shown) on the other hand uses reference voltages as many number as that corresponding to a resolution so that resistors used for a reference voltage generator are required as many number as that corresponding to the resolution. The number of resistors is 4096, for example for an A/D converter outputting a digital signal of 12 bits. As the resolution becomes high, the number of resistors abruptly increases. In order to improve the performance of an A/D converter, it is important to improve the resolution as well as the precision. However, the precision of resistor is proportional to a square root of the area of a resistor. Therefore, if the resolution is improved by increasing the number of resistors and the precision is improved by increasing the resistor area, the area of all resistors increases greatly, which is impractical for application to IC circuits.

An example of two-step type A/D converters eliminating such disadvantages is shown in FIG. 2. In FIG. 2, an instantaneous value of an input voltage is sampled at a constant period by a sample-and-hold circuit 111, and supplied to an upper level A/D converter 112 and a subtracter 115. The instantaneous value is first converted into a digital signal as an upper level conversion output (UCO) by the upper level A/D converter 112 having a relatively low precision. This digital signal is outputted from a first output terminal 116. The digital signal is D/A converted by a D/A converter 113, the converted analog signal being subtracted from the input instantaneous value by the subtracter 115. The obtained difference between the input instantaneous value and the converted analog signal is then converted into a digital signal as a lower level conversion output (LCO), by a lower level converter 114 having a relatively high precision. This digital signal is outputted from a second output terminal 117. Using the upper and lower level conversion outputs, an A/D converted value of the input voltage is obtained.

This conversion method however requires a sample-and-hold circuit and a subtracter.

An improved A/D converter dispensing with such a D/A converter and subtracter is shown in FIG. 3. As shown in FIG. 3, this A/D converter has an upper level encoder 126 for outputting an upper level digital output (UDO) and a lower level encoder 127 for outputting a lower level digital output (LDO). Outputs from comparators 125A, 125A, are inputted to the upper level encoder 126, whereas outputs from comparators 125B, 125B, ... are inputted to the lower level encoder 127. An input voltage (INPUT) at a terminal 122 is applied to non-inverting input terminals of these comparators 125A and 125B. An inverting terminal of each comparator 125A is supplied with a voltage which is obtained by dividing a voltage $(+V_{ref})-(-V_{ref})$ across terminals 120 and 121 by one of a plurality of resistor groups 123A each having a plurality of resistors 123. An inverting input terminal of each comparator 123B is supplied with one of a plurality of predetermined voltage values (reference voltage values) selected by a switch (switching means) 124. Namely, the inverting input terminal of one comparator 125B is connected to one terminal of one resistor 123 via a corresponding one of the switches 124. When one of the switches 124 is selectively turned on in response to an output of the upper level encoder 126, a voltage at one terminal of the resistor 123 connected to the on-switch 124 is supplied to the non-input terminal of the comparator 125B.

With the A/D conversion method described with FIG. 3, the reference voltage is selected by the switching means 124. This method however requires resistors same in number as the serial type A/D converter, and the number of resistors considerably increases as the resolution is to be improved.

Conventional parallel type A/D converters and two-step type A/D - D/A converters require $2^n$ resistors if a resolution of n bits is necessary. Therefore, they are associated with the disadvantage that a great number of resistors are required if the resolution is to be improved.

SUMMARY OF THE INVENTION

It is an object of the present invention to eliminate the above-described disadvantages and provide an A/D converter capable of being formed with a relatively small number of resistors.

According to one aspect of the present invention, there is provided an A/D converter comprising: first divided reference voltage output means for dividing a first reference voltage by m and outputting a plurality of first divided reference voltages; second divided reference voltage output means for dividing a second reference voltage by and outputting a plurality of second divided reference voltage; level shift means for level-shifting the plurality of second divided reference voltages in accordance with an input voltage to be A/D converted, and outputting a plurality of third reference voltages; comparator means for comparing each of the plurality of first divided reference voltages with each of the plurality of third divided reference voltages, and outputting a combination of one of the first divided reference voltage and one of the third divided reference voltages having a smallest voltage difference therebetween; and encoder means for outputting a digital signal converted from the input signal, in accordance with the combination outputted from the comparator means.

According to another aspect of the present invention, there is provided an A/D converter comprising: first divided reference voltage output means for dividing a first reference voltage by m and outputting a plurality of first divided reference voltages; level shift means for level-shifting one of the first divided reference voltages in accordance with an input voltage to be A/D converted, and outputting the level-shifted first divided reference voltage; second divided reference voltage output means for dividing the level-shifted first divided reference voltage by n, and outputting a plurality of second divided reference voltages; comparator means for comparing each of the plurality of first divided reference voltages with each of the plurality of second third divided reference voltages, and outputting a combination of one of the first divided reference voltage and one of the second divided reference voltages having a smallest voltage difference therebetween; and encoder means for outputting a digital signal converted from the input signal, in accordance with the combination outputted from the comparator means.

BRIEF DESCRIPTION OF THE DRAWINGS

FIG. 6 is a block diagram showing a second embodiment of the A/D converter according to the present invention.

FIGS. 7 and 7A show a differential type comparator, and a circuit diagram showing a modification of the second embodiment using differential type comparators.

DESCRIPTION OF THE PREFERRED EMBODIMENTS

Prior to describing the embodiments of the present invention, the concept of the invention will be described.

The first divided reference voltage output means generates first divided reference voltages obtained by equally dividing a first reference voltage by The second divided reference voltage output means generates second divided reference voltages obtained by equally dividing a first reference voltage by n. For example, if the first and second reference voltages are set equal, the differences between the first and second divided reference voltages is "0" at opposite terminals of the division circuits, and a minimum "$|1/m-1/n|$" at the other division points of the circuits. The second divided reference voltages are level-shifted by the input voltage to be A/D converted, to obtain third divided reference voltages. The differences between respective pairs of the first and second divided reference voltages change with the input voltage to be A/D converted which can be known by checking a pair of the first and third divided reference voltages providing the minimum voltage difference. Therefore, by properly selecting the values m and n, it is possible to A/D convert with a smaller number of divisions and a high resolution.

If the voltage division is performed using resistors, the number of resistors can be reduced greatly. If the A/D converter is implemented as an IC circuit, the reduced number of resistors enables each resistor to have a larger area, improving the precision of resistor as compared with a conventional A/D converter. Furthermore, the chip area can be reduced if the resistor precision is intended to be the same as a conventional A/D converter. Even if the first and second reference voltages are different, the resolution of A/D conversion can be obtained to the extent not expected by the number of divisions of reference voltages, by using the same principle of the present invention.

Figure 1:
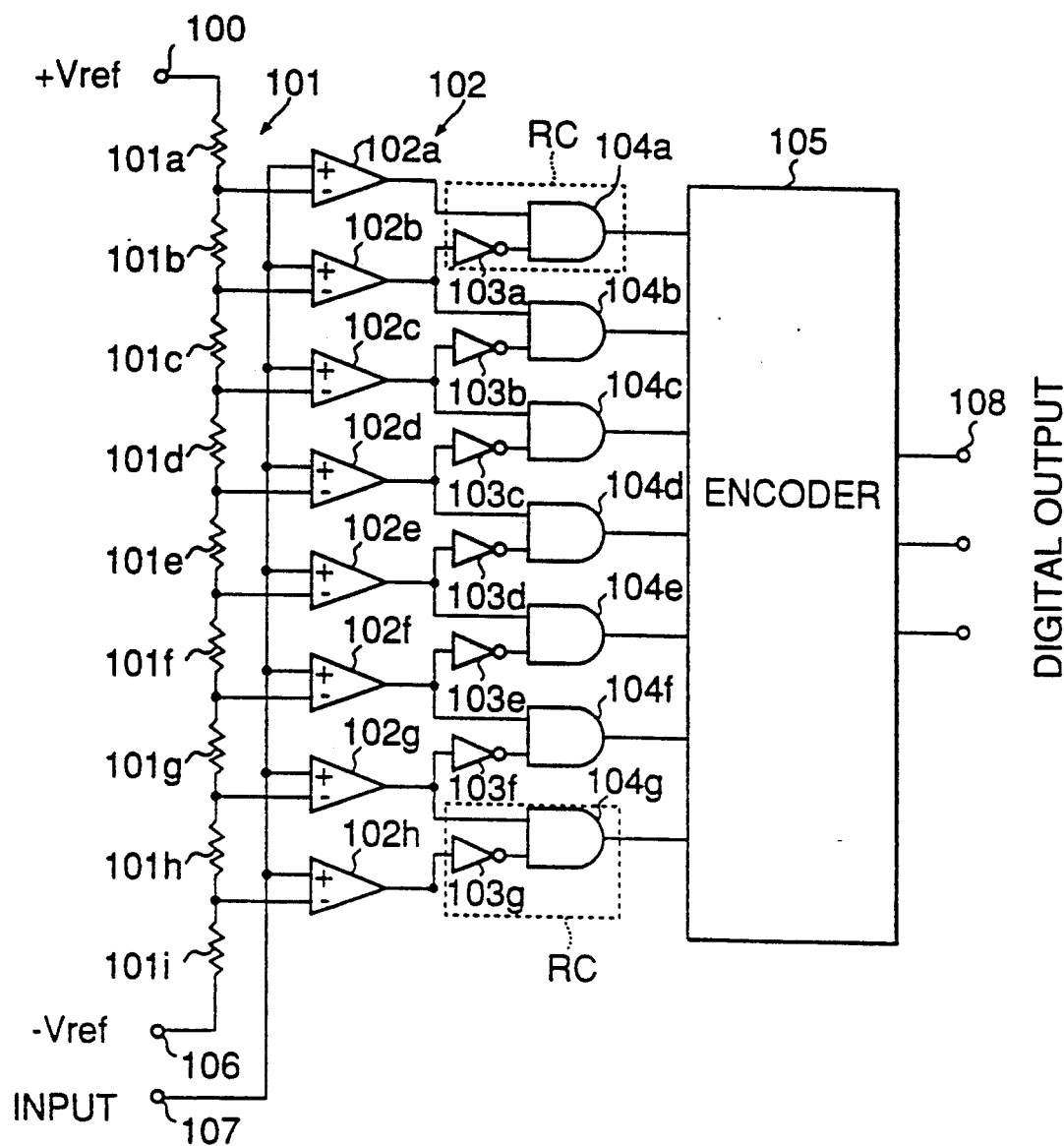
FIG. 1 is a block diagram showing an example of conventional A/D converters.
Figure 2:
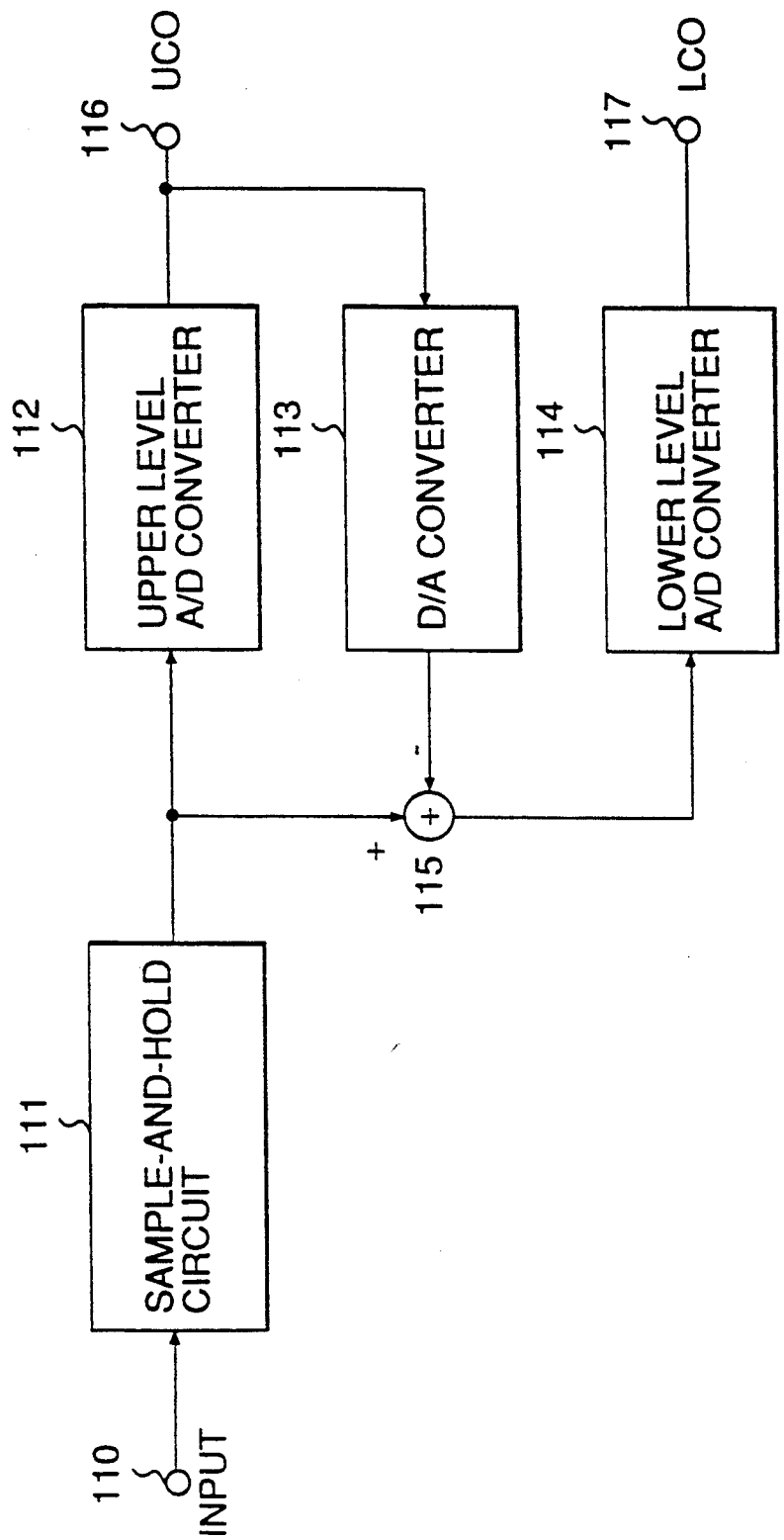
FIG. 2 is a block diagram showing another example of conventional A/D converters.
Figure 3:
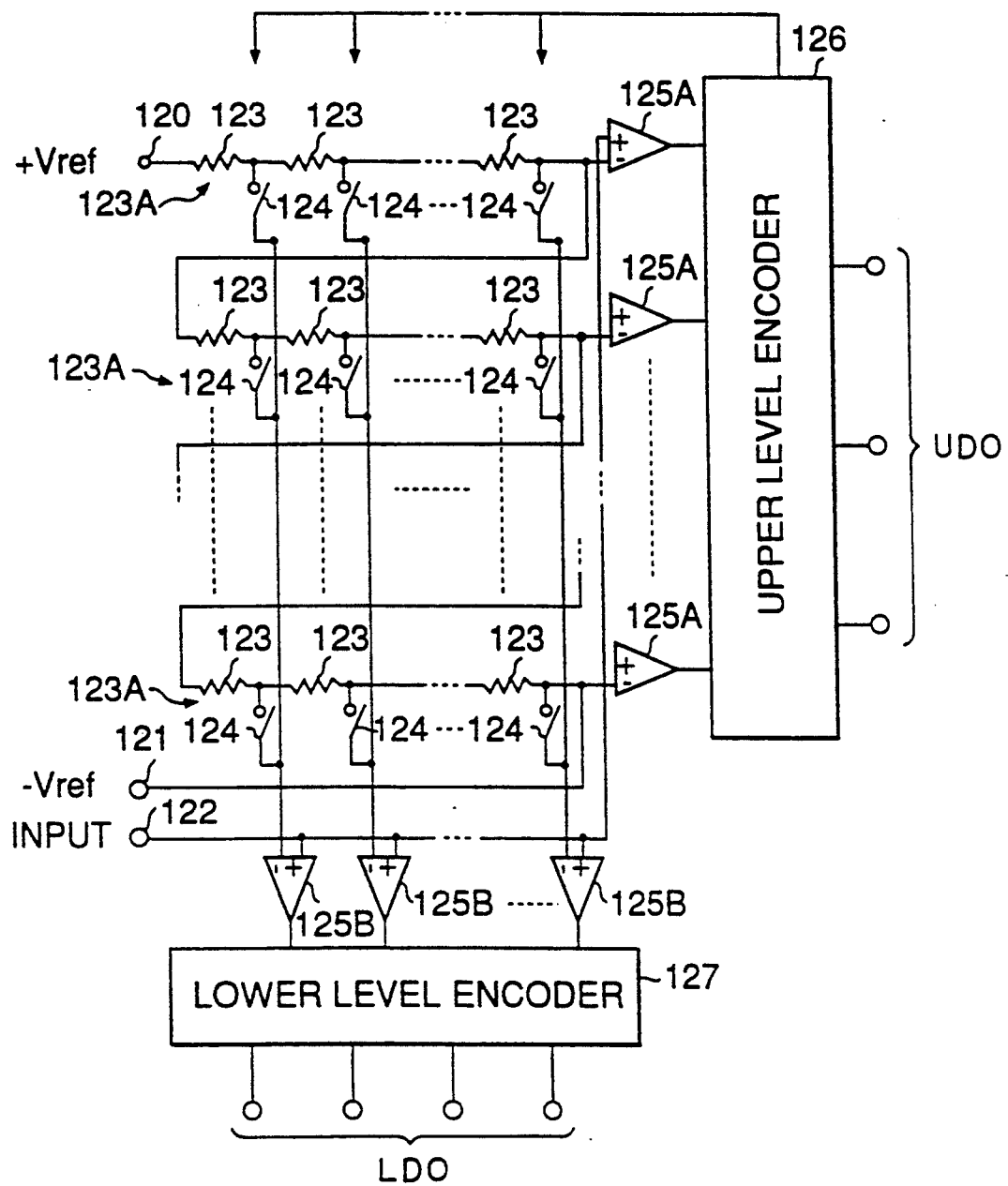
FIG. 3 is a block diagram showing a further example of conventional A/D converters.
Figure 4:
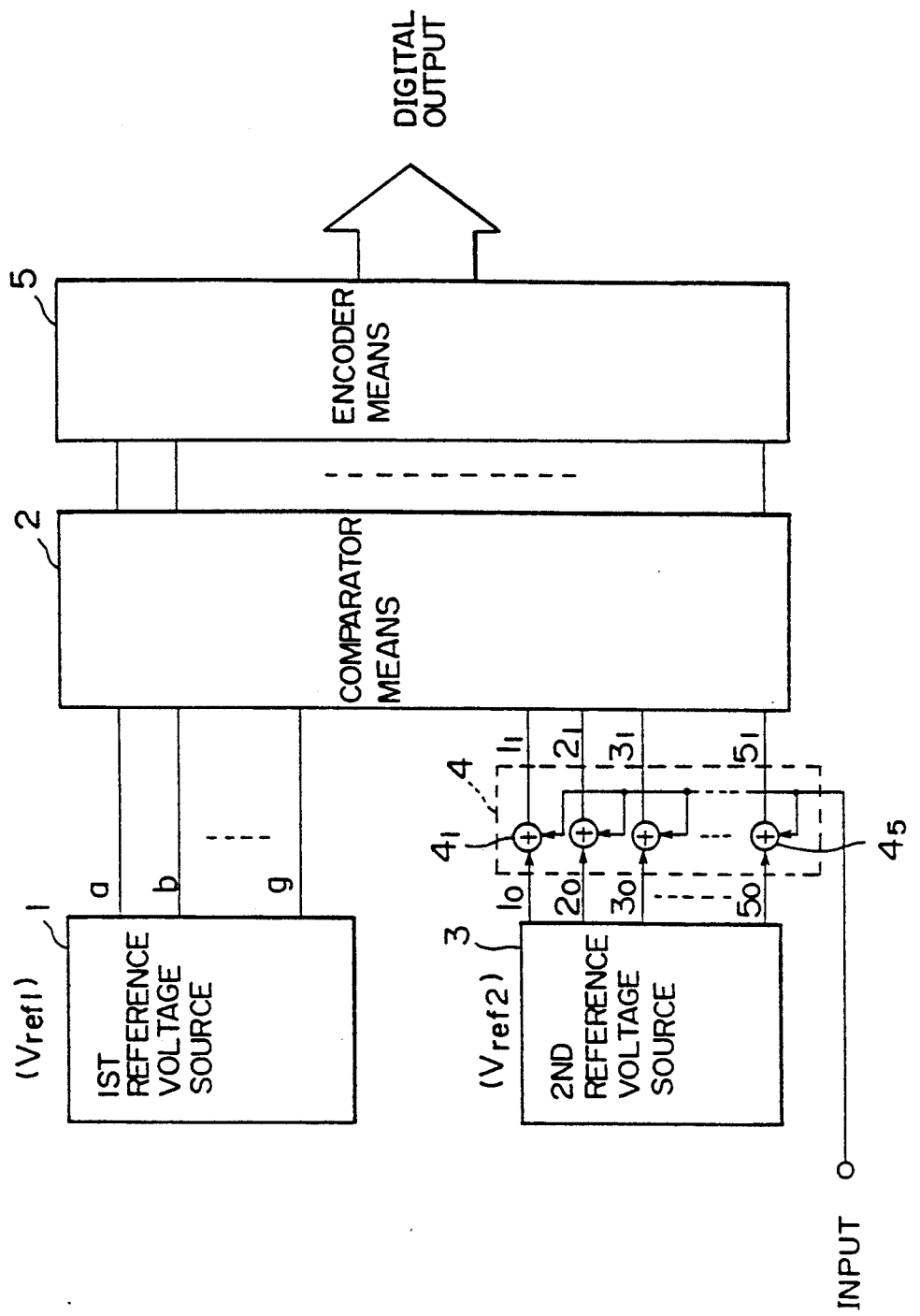
FIG. 4 is a block diagram showing an A/D converter according to a first embodiment of the present invention.

A first embodiment of the present invention will now be described with reference to the block diagram of FIG. 4 showing the outline of the present invention. A first reference voltage source 1 supplies first output voltages a to q to one input terminal group of a comparator means 2 as reference voltages to be compared. The first output voltages a to q are obtained by equally dividing a reference voltage $V_{ref1}$ by m (m is a natural number, in this example m=6), providing a constant voltage difference between two adjacent voltages. The first voltages a to q constitute a sequence of integer multiples of the constant voltage difference, providing a so-called main voltage scale of fixed voltage value series.

A second voltage source 3 supplies output voltages $1_0$ to $5_0$ to a level shift means 4. The output voltages $1_0$ to $5_0$ are obtained by equally dividing a reference voltage $V_{ref2}$ by n (n is a natural number, in this example n=4), providing a constant voltage difference between two adjacent voltages. The level shift means 4 shifts the levels of the output voltages $1_0$ and $5_0$ in accordance with an input voltage (INPUT) to obtain second voltages $1_1$ to $1_5$ which are supplied to the other input terminal group of the comparator means 2. The level-shifted second output voltages $1_1$ to $1_5$ provide a sub voltage scale moving with the level shift and having graduations formed by the respective second output voltages $1_1$ to $1_5$. The level shift means 4 is formed by adders $4_1$ to $4_5$ same in number as that (number 5) of the divided voltages $1_0$ to $5_0$, each adder being supplied at one input terminal with one of the divided voltages $1_0$ to $5_0$ and at the other input terminal with the input voltage (INPUT).

The comparator means 2 compares the first output voltages a to q from the first voltage source 1 with the second output voltages $1_1$ to $5_1$ from the level shift means 4, to thereby detect one of the first output voltages a to q and one of the second output voltages $1_1$ to $5_1$ having a voltage difference of zero or within a predetermined value. The comparator means 2 informs an encoder means (encoder) 5 of a combination of output terminal numbers of the first reference voltage source 1 and level shift means 4 at which the first and second voltages were detected. In other words, the comparator means 2 detects that one of the graduations of the main voltage scale becomes coincident with, or substantially coincident with, one of the graduations of the sub voltage scale, and informs the encoder means 5 of the identification of the pair of two graduations coincident or substantially coincident with each other.

The encoder means 5 is constructed of logical circuits, a microprocessor, or the like, and outputs encoded codes corresponding to the outputs of the comparator means 2. Each time an output detected by the comparator means 2 is supplied, the encoder means 5 outputs as a digital signal a binary number corresponding to the detected output of the comparator means 2. In this manner, the encoder means 5 outputs the digital signal corresponding to the level of the input signal (INPUT).

Next, the concept of comparing the first output voltages with the second output voltages will be explained with reference to FIG. 5A-5E. In FIGS. 5A-5F, the first output voltages a to q of the first reference voltage source 1 are shown on the left side of each diagram as the graduations of the main voltage scale and the second output voltages $1_1$ to $5_1$ of the level shift means are shown on the right side of each diagram as the gradations of the sub voltage scale, wherein reference voltage $V_{ref1} = 2 * $ (reference voltage $V_{ref2}$), m=6, and D=4.

As shown in FIGS. 5(A) to 5(E), as the input voltage (INPUT) becomes high, the second output voltages $1_1$ to $5_1$ are level-shifted. Pairs of the first output voltages a to q and the second output voltages $1_1$ to $5_1$ having the minimum or maximum voltage difference therebetween, sequentially change. When the input voltage (INPUT) is "0", the output voltages a and $1_1$ (and d and $5_1$) become equal. As the input voltage (INPUT) rises, pairs having the minimum voltage difference, sequentially change from b and $2_1$, c and $3_1$, and to d and $4_1$. When the input voltage (INPUT) becomes (b - a), the output voltages e and $5_1$ (and b and $1_1$) become equal. As the input voltage (INPUT) further rises, pairs having the minimum voltage difference sequential, change from c and $2_1$, d and $3_1$, e and $4_1$, f and $5_1$ (and c and $1_1$), d and $2_1$, e and $3_1$, f and $4_1$, . . . If the relationships between the levels of the input signal (INPUT) and the combinations of the first output voltages a to q and second output voltages $1_1$ to $5_1$ are checked beforehand, then it is possible to know the input voltage (INPUT) from a combination of the output voltage terminal numbers giving a coincidence or substantial coincidence between the first and second output voltages. Namely, the sub voltage scale moves relative to the main voltage scale in accordance with the level of the input voltage (INPUT), and the level of the input voltage (INPUT) is determined from a combination of graduations coincident or substantially coincident with each other. The encoder means 5 supplied with such a combination of graduations generates a code or digital signal corresponding to the level of the input voltage (INPUT).

Figure 5A:
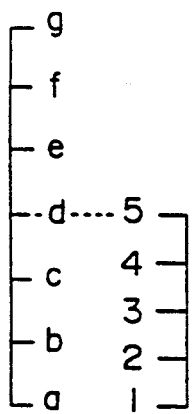
FIGS. 5A-5F are diagrams explaining the operating principle of the embodiments.
Figure 5B:
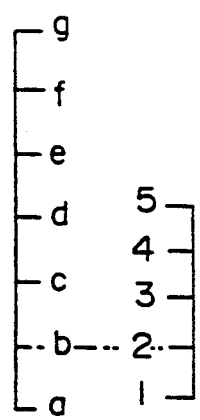
Figure 5C:
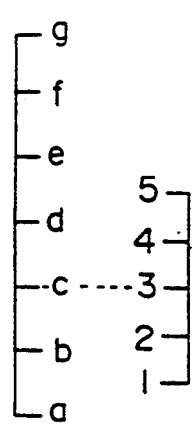
Figure 5D:
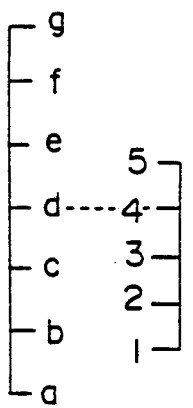
Figure 5E:
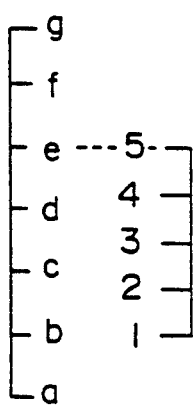
Figure 5F:
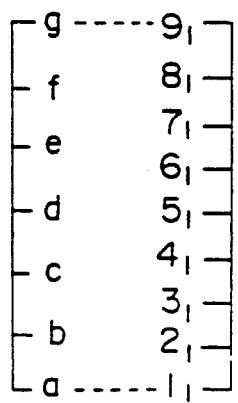

FIG. 5A illustrates the case of $V_{ref1} = V_{ref2}$ wherein $V_{ref1}$ is equally divided into six voltages and $V_{ref2}$ is equally divided into eight voltages. This case corresponds to the case shown in FIG. 5(A), with the input voltage (INPUT) of "0".

Use of such a circuit arrangement requires $3 * 2^{n/2}$ resistors as compared to $2^n$ resistors of a conventional A/D converter for obtaining a resolution of n bits. For example, for a resolution of 16 bits, a conventional A/D converter requires 65,536 resistors, whereas the A/D converter of the present invention requires 768 resistors, greatly reducing the number of resistors.

The second embodiment (parallel type A/D converter) of the present invention will be described with reference to FIG. 6. In FIG. 6, like elements to those shown in FIG. 4 are represented by using identical reference numerals. A reference voltage source 1 is constructed of a resistive divider circuit $RD_1$ having a plurality of resistors R with the same resistance connected across reference voltages $+V_{ref}$ and $-V_{ref}$. A reference voltage source 3 is constructed of a similar resistive divider circuit $RD_2$ applied across which are an output voltage d of the reference voltage source 1 and the reference voltage $-V_{ref}$. Both the resistive divider circuits $RD_1$ and $RD_2$ are therefore separated by a buffer amplifier BA from the viewpoint of impedance therebetween. An input voltage (INPUT) is arranged to be applicable to the opposite terminals of the reference voltage source 3 via adders 4A and 4A. the input voltage (INPUT) is superposed upon each output voltage of the reference voltage source 3 via the adders 4A and 4A serving as a level shift means 4. A comparator means 2 is constructed of level comparators $2a$ to $2l$. As the input voltage (INPUT) rises, the outputs of the level comparators $2a$ to $2l$ are sequentially inverted in the order of $2i$, $2e$, $2a$, $2j$, $2f$, $2b$, $2k$, $2g$, $2c$, $2l$, $2h$, and $2d$. This output inversion is converted into a code preset by an encoder 5 to thereby output a digital signal corresponding to the level of the input voltage (INPUT).

Figure 7A:
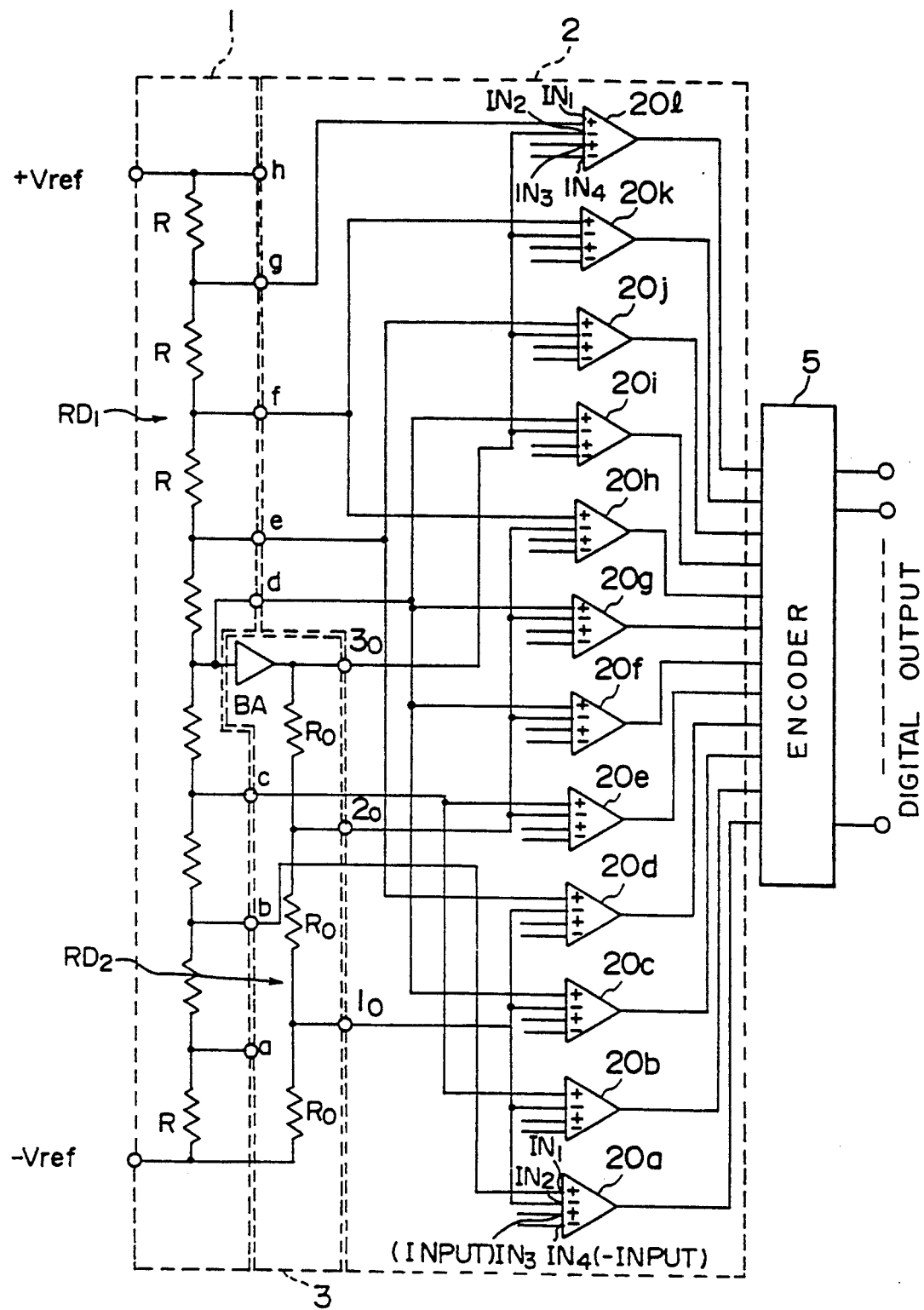

In place of the level comparators $2a$ to $2l$ shown in FIG. 6, differential type comparators $20a$ ($\sim 20l$) shown in FIG. 7 may be used. This comparator 20 has a pair of input terminals $IN_3$ and $IN_4$ in addition to a pair of input terminals $IN_1$ and $IN_2$ like those of the level comparator $2a$ shown in FIG. 6. An input voltage (INPUT) is applied to the non-inverting input terminal $IN_3$, and a negative input voltage (−INPUT) is applied to the inverting input terminal $IN_4$. With the input voltages (INPUT and −INPUT) being applied to the input terminals $IN_3$ and $IN_4$, the comparator $20a$ operates in the same manner as the case where the input voltage (INPUT) is applied to the adders 4A and 4A shown in FIG. 6. It is therefore unnecessary to use the adders 4A and 4A shown in FIG. 6 if the comparators $20a$ shown in FIG. 7 are used. An example of such a circuit is shown in FIG. 6A. In this case, the conversion precision improves because of processing by differential type circuits.

Figure 8:
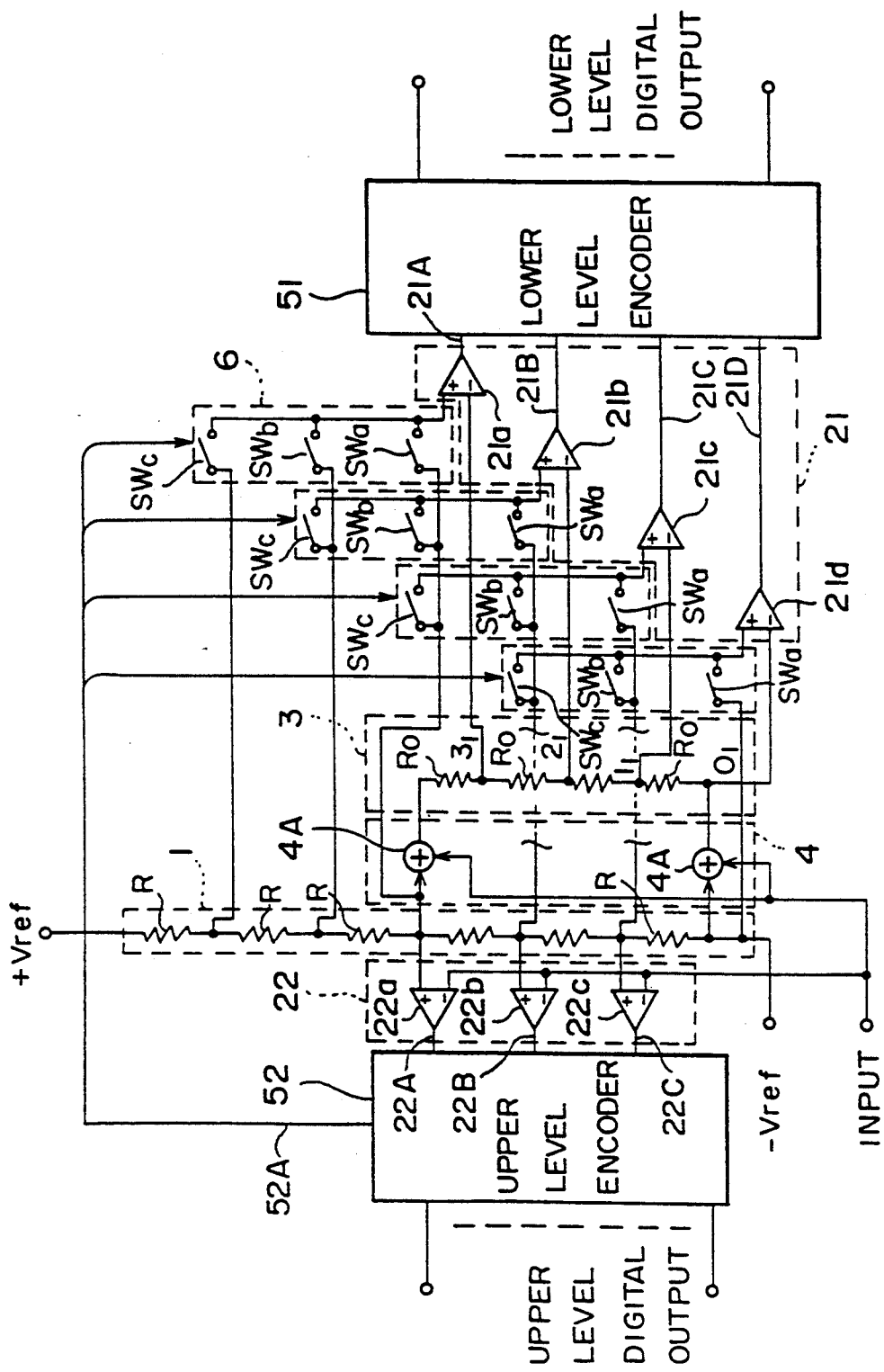
FIG. 8 is a block diagram showing a third embodiment of the A/D converter according to the present invention.

The third embodiment (serial-parallel type A/D converter) of the present invention will be described with reference to FIG. 8. In FIG. 8, like elements to those shown in FIGS. 4 and 6 are represented by using identical reference numerals. Reference numeral 1 represents a first reference voltage source, reference numeral 3 represents a second reference voltage source, reference numeral 4 represents a level shift means, reference numeral 6 represents a switching means, reference numeral represents a lower level comparator means, reference numeral 22 represents an upper level comparator means, reference numeral 51 represents a lower level encoder, and reference numeral 52 represents an upper level encoder.

The upper level comparator means 22 has level comparators $22a$ to $22c$. Different first reference voltages generated through division by the first reference voltage source 1 are applied to non-inverting input terminals of the level comparators $22a$ to $22c$. An input voltage (INPUT) is applied to inverting input terminals of the comparators $22a$ and $22c$. Outputs of the level comparators $22a$ to $22c$ are supplied to the upper level encoder 52. The upper level comparator means 22 and upper level encoder 52 encode the upper bits of the input voltage (INPUT). An output of the upper encoder 52 controls the switching means 6 in the following manner to switch inputs to the lower level comparator means 21 having comparators $21a$ to $21d$. Namely, outputs $0_1$ to $3_1$ of the second reference voltage source 3 are supplied to inverting input terminals of the comparators $21a$ to $21d$. Adjacent three first reference voltages of the first reference voltage source 1 are supplied via the switching means 6 to non-inverting input terminals of the comparators 21a to 21d. When ones of switches SW(SW$_a$-SW$_c$) of the switching means 6 turn on, ones of the three reference voltages are selected and supplied to the non-inverting input terminals of corresponding ones of the comparators 21a to 21d. The selective turn-on of the switches SW is controlled by an output of the upper level encoder 52. Specifically, the switches SW of the switching means 6 are selectively turned on in the following manner. Representing a first reference voltage p as a voltage nearest to, and not higher than, the input voltage (INPUT), when this first reference voltage p is supplied from the upper level encoder 52, each first reference voltage nearest to, and higher than, each second reference voltage, is compared with each second reference voltage by each comparator 21a to 21d of the lower level comparator means 21.

Figure 9:
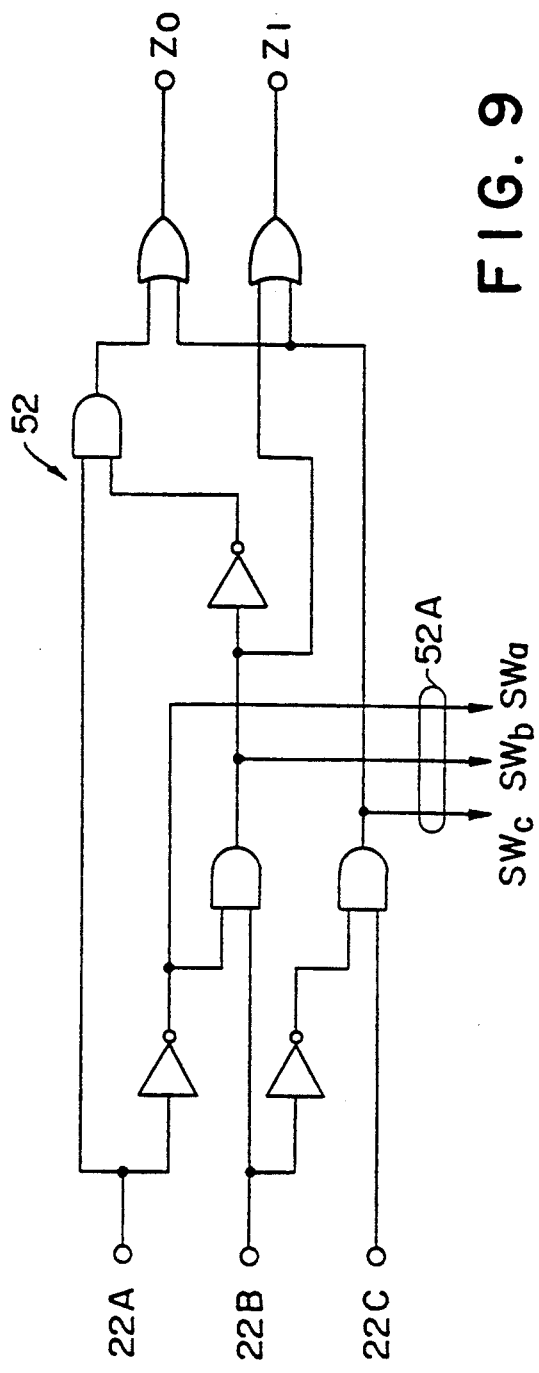
FIGS. 9 and 10 are circuits showing examples of upper and lower level encoders in FIG. 8.
Figure 10:
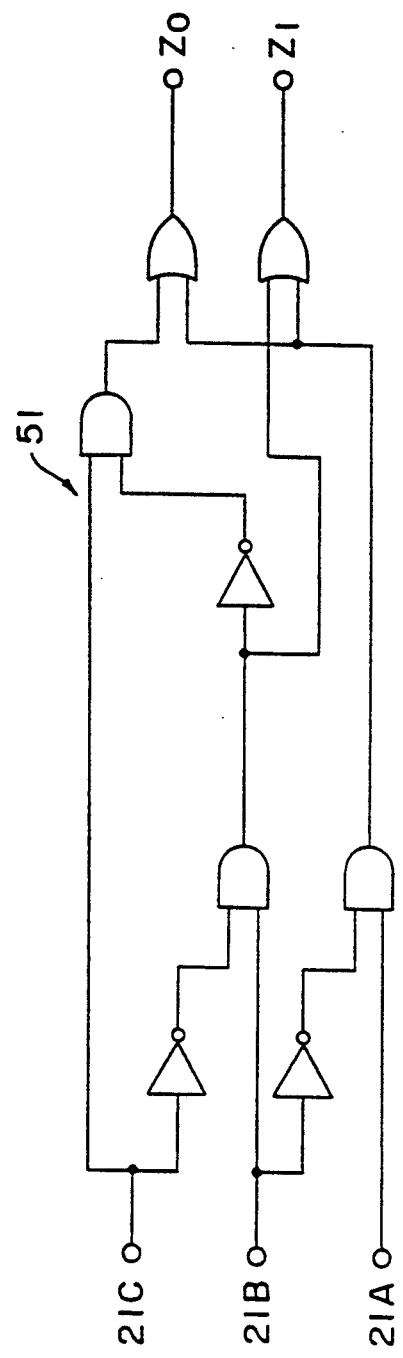

Examples of upper and lower level encoders 52 and 51 are shown in FIGS. 9 and 10, respectively.

With this circuit arrangement, the number of level comparators can be considerably reduced.

The number of reference voltage divisions is not limited to the above embodiments, but it is determined as desired. Furthermore, a reference voltage division method is not limited to a resistive division method, but other methods may also be used and selected as desired, such as a capacitive division method.

As described so far, the A/D converter of the present invention can greatly reduce the number of resistors constituting a reference voltage source, and can reduce the area of IC circuit resistor patterns and make compact the circuit size, as compared with a conventional A/D converter having the same precision. With the same resistor pattern area, it is possible to improve the resistor precision and hence A/D conversion precision. Furthermore, with the considerable reduction of the number of resistors, the manufacturing cost of laser trimming for improved resistor precision can be reduced advantageously.

What is claimed is:

1. An A/D converter comprising:
   first divided reference voltage output means for dividing a first reference voltage by m and outputting a plurality of first divided reference voltages;
   second divided reference voltage output means for dividing a second reference voltage by and outputting a plurality of second divided reference voltages;
   level shift means for level-shifting said plurality of second divided reference voltages in accordance with an input voltage to be A/D converted, and outputting a plurality of third divided reference voltages;
   comparator means for comparing each of said plurality of first divided reference voltages with each of said plurality of third divided reference voltages, and outputting a combination of one of said first divided reference voltage and one of said third divided reference voltages having a smallest voltage difference therebetween; and
   encoder means for outputting a digital signal converted from said input signal, in accordance with said combination outputted from said comparator means.

2. An A/D comparator according to claim 1, wherein said first divided reference voltage output means equally divides said first reference voltage by m and said second divided reference voltage output means equally divides said second reference voltage by n, said m being not equal to said n.

3. An A/D converter according to claim 2, wherein said first and second reference voltages are the same.

4. An A/D converter according to claim 2, wherein said first and second reference voltages are different, and one of said first divided reference voltages is equal to said second reference voltage.

5. An A/D converter according to claim 4, wherein one of said first divided reference voltages is equally divided by r, and said second reference voltage equally is divided by s, said r being not equal to said s.

6. An A/D converter according to claim 5, wherein said r and said s have no common divisor other than 1.

7. An A/D converter according to claim 1, wherein said level shift means adds said second divided reference voltage to said input voltage.

8. An A/D converter according to claim 2, wherein said level shift means adds said second divided reference voltage to said input voltage.

9. An A/D converter according to claim 1, wherein said second reference voltage is supplied from said first divided reference voltage output means.

10. An A/D converter according to claim 2, wherein said second reference voltage is supplied from said first divided reference voltage output means.

11. An A/D converter according to claim 4, wherein said second reference voltage is supplied from said first divided reference voltage output means.

12. An A/D converter according to claim 5, wherein said second reference voltage is supplied from said first divided reference voltage output means.

13. An A/D converter according to claim 6, wherein said second reference voltage is supplied from said first divided reference voltage output means.

14. An A/D converter according to claim 9, wherein said level shift means is included in said comparator means.

15. An A/D converter according to claim 10, wherein said level shift means is included in said comparator means.

16. An A/D converter according to claim 11, wherein said level shift means is included in said comparator means.

17. An A/D converter according to claim 12, wherein said level shift means is included in said comparator means.

18. An A/D converter according to claim 13, wherein said level shift means is included in said comparator means.

19. An A/D converter comprising:
   first divided reference voltage output means for dividing a first reference voltage by m and outputting a plurality of first divided reference voltages;
   level shift means for level-shifting one of said first divided reference voltages in accordance with an input voltage to be A/D converted, and outputting said level-shifted first divided reference voltage;
   second divided reference voltage output means for dividing said level-shifted first divided reference voltage by n and outputting a plurality of second divided reference voltages;
   comparator means for comparing each of said plurality of first divided reference voltages with each of said plurality of second divided reference voltages, and outputting a combination of one of said first divided reference voltage and one of said second divided reference voltages having a smallest voltage difference therebetween; and encoder means for outputting a digital signal converted from said input signal, in accordance with said combination outputted from said comparator means.

20. An A/D converter comprising:

first divided reference voltage output means for dividing a first reference voltage by m and outputting a plurality of first divided reference voltages;

level shift means for level-shifting one of said first divided reference voltages in accordance with an input voltage to be A/D converted, and outputting said level-shifted first divided reference voltage;

second divided reference voltage output means for dividing said level-shifted first divided reference voltage by and outputting a plurality of second divided reference voltages;

first comparator means for comparing a plurality of optional ones of said first divided reference voltages with said input voltage;

first encoder means for outputting an upper level digital signal converted from said input signal, in accordance with an output from said first comparator means;

second comparator means for comparing each of said second divided reference voltages with an optional one of said first divided reference voltages selected by said first encoder means; and second encoder means for outputting a lower level digital signal converted from said input signal, in accordance with an output from said second comparator means.

* * * * *